United States Patent
Yen (10) Patent No.: US 10,298,031 B2
(45) Date of Patent: May 21, 2019

(54) BATTERY DEVICE AND BATTERY PROTECTION METHOD

(71) Applicant: Quanta Computer Inc., Taoyuan (TW)

(72) Inventor: Wei-Ting Yen, Taoyuan (TW)

(73) Assignee: QUANTA COMPUTER INC., Guishan Dist., Taoyuan (TW)

(*) Notice: Subject to any disclaimer, the term of this patent is extended or adjusted under 35 U.S.C. 154(b) by 1 day.

(21) Appl. No.: 15/660,054

(22) Filed: Jul. 26, 2017

(65) Prior Publication Data
US 2018/0316200 A1    Nov. 1, 2018

(30) Foreign Application Priority Data

Apr. 28, 2017  (TW) .............................. 106114241 A (51) Int. Cl.
*H01M 2/34* (2006.01)
*H01M 10/44* (2006.01)
(Continued)

(52) U.S. Cl.
CPC .......... *H02J 7/0026* (2013.01); *G01R 31/389* (2019.01); *H01M 2/348* (2013.01);
(Continued)

(58) Field of Classification Search
CPC ...... H02J 7/0026; H02H 7/18; H01M 10/443; H01M 2/348; H01M 10/486;
(Continued)

(56) References Cited

U.S. PATENT DOCUMENTS

| 3,656,045 A * | 4/1972 | Frezzolini | ................. H02H 7/18 307/10.7 |
| 4,509,102 A * | 4/1985 | Ayer | ........................ H02H 7/18 340/636.13 |

(Continued)

FOREIGN PATENT DOCUMENTS

| EP | 2 993 757 A1 | 3/2016 |
| JP | 4-299030 A | 10/1992 |

(Continued)

OTHER PUBLICATIONS

Chinese language office action dated Jan. 4, 2018, issued in application No. TW 106114241.
(Continued)

*Primary Examiner* — M Baye Diao
(74) *Attorney, Agent, or Firm* — McClure, Qualey & Rodack, LLP (57) ABSTRACT

A battery device is provided. The battery device includes: a battery module, a protection device, a battery management circuit, and a battery protection circuit. The battery module includes one or more battery cells. The battery management circuit is for managing the protection device and charging and discharging of the battery module. When the battery device is in a charging mode, the battery protection circuit periodically checks and calculates a direct current internal resistance (DCIR) of the battery module, and determines a current operation temperature of the battery module and a temperature range corresponding to the current operation temperature. When the battery protection circuit determines that the DCIR is greater than a predetermined multiple of a first threshold corresponding to the temperature range, the battery protection circuit informs the battery management circuit to cut off the protection device.

8 Claims, 4 Drawing Sheets

(51) Int. Cl.
    *H01M 10/48*     (2006.01)
    *G01R 31/389*     (2019.01)
    *H02J 7/00*     (2006.01)
    *H01M 10/42*     (2006.01)
    *H02H 7/18*     (2006.01)

(52) U.S. Cl.
    CPC ....... *H01M 10/425* (2013.01); *H01M 10/443* (2013.01); *H01M 10/486* (2013.01); *H02H 7/18* (2013.01); *H02J 7/0031* (2013.01); *H01M 2010/4271* (2013.01); *H01M 2200/103* (2013.01); *H01M 2220/30* (2013.01)

(58) Field of Classification Search
    CPC ....... H01M 10/425; H01M 2010/4271; H01M 2200/103; H01M 2220/30
    USPC ......................................................... 320/134
    See application file for complete search history.

(56) References Cited

U.S. PATENT DOCUMENTS

| | | | | |
|---|---|---|---|---|
| 4,755,735 A * | 7/1988 | Inakagata | ............. | H02J 7/0091 320/150 |
| 5,608,304 A * | 3/1997 | Okumura | ............. | H02J 7/0031 320/134 |
| 5,894,212 A * | 4/1999 | Balogh | ................ | H02J 7/0026 320/116 |
| 5,963,019 A * | 10/1999 | Cheon | ..................... | H02H 7/18 320/134 |
| 5,977,751 A * | 11/1999 | Blessing | ............... | H02J 7/0029 320/134 |
| 6,194,869 B1 * | 2/2001 | Peterzell | .................. | H02H 3/12 320/134 |
| 6,208,117 B1 * | 3/2001 | Hibi | ...................... | H02J 7/0021 320/134 |
| 8,987,935 B2 * | 3/2015 | King | ..................... | B60L 3/0046 307/10.1 |
| 9,172,261 B2 * | 10/2015 | Suzuki | .................. | H02J 7/0026 |
| 9,806,547 B2 * | 10/2017 | Carre | .................... | H02J 7/0052 |
| 9,971,608 B1 * | 5/2018 | Venkatasamy | ........ | G06F 9/4418 |
| 10,009,852 B2 * | 6/2018 | Law | ..................... | H04W 52/027 |
| 2011/0234167 A1 * | 9/2011 | Kao | ..................... | G01R 31/361 320/132 |
| 2012/0170157 A1 * | 7/2012 | Holsen | .................... | G06F 1/263 361/1 |
| 2015/0069830 A1 * | 3/2015 | Huang | ..................... | H02H 7/18 307/9.1 |
| 2016/0064980 A1 * | 3/2016 | Jung | ..................... | H02J 7/0047 320/162 |
| 2016/0380448 A1 * | 12/2016 | Seo | ........................ | H02J 7/0026 320/112 |
| 2017/0269655 A1 * | 9/2017 | Chu | ........................ | G06F 1/206 |

FOREIGN PATENT DOCUMENTS

| | | |
|---|---|---|
| JP | 2001-145273 A | 5/2001 |
| JP | 2004-56937 A | 2/2004 |
| JP | 2004-64840 A | 2/2004 |
| JP | 2009-112113 A | 5/2009 |
| JP | 2017-025709 A | 2/2017 |
| KR | 20150009312 A | 1/2015 |
| TW | 201133985 A1 | 10/2011 |

OTHER PUBLICATIONS

European Search Report dated Mar. 7, 2018, issued in application No. 17185035.7-1202.
Japanese language office action dated Feb. 5, 2019, issued in application No. JP 2017-223564.
Korean language office action dated Mar. 13, 2019, issued in application No. 9-5-2019-018760839.

* cited by examiner

BATTERY DEVICE AND BATTERY PROTECTION METHOD

CROSS REFERENCE TO RELATED APPLICATIONS

This Application claims priority of Taiwan Patent Application No. 106114241, filed on Apr. 28, 2017, the entirety of which is incorporated by reference herein.

BACKGROUND OF THE INVENTION

Field of the Invention

The present invention relates to a battery device, and, in particular, to a battery device and a battery protection method thereof.

Description of the Related Art

Currently, portable electronic devices such as smartphones, tablet PCs, and laptops requires batteries as a power source. However, battery explosion events often occur in the portable electronic devices on the market. No matter a product is brand new or outdated, its battery is possible to self-ignites or burn during charging. Thus, the battery design for the portable electronic devices on the market is not absolutely safe.

Accordingly, there is demand for a battery device and a battery protection method to solve the aforementioned problem and improve the battery safety.

BRIEF SUMMARY OF THE INVENTION

A detailed description is given in the following embodiments with reference to the accompanying drawings.

In an exemplary embodiment, a battery device is provided. The battery device includes: a battery module, a protection device, a battery management circuit, and a battery protection circuit. The battery module includes one or more battery cells. The battery management circuit is for managing the protection device and charging and discharging of the battery module. When the battery device is in a charging mode, the battery protection circuit periodically checks and calculates a direct current internal resistance (DCIR) of the battery module, and determines a current operation temperature of the battery module and a temperature range corresponding to the current operation temperature. When the battery protection circuit determines that the DCIR is greater than a predetermined multiple of a first threshold corresponding to the temperature range, the battery protection circuit informs the battery management circuit to cut off the protection device.

In another exemplary embodiment, a battery protection method for use in a battery device is provided. The battery device includes a battery module, a protection device, a battery management circuit, and battery protection circuit. The method includes the steps of: when the battery device is in a charging mode, utilizing the battery protection circuit to perform the steps of: periodically checking and calculating the direct current internal resistance; determining the current operation temperature of the battery module and a temperature range that corresponds to the current operation temperature; informing the battery management circuit to cut off the protection device when the battery protection circuit determines that the DCIR is larger than a predetermined multiple of a first threshold corresponding to the temperature range.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

First, it should be understood that each different type of battery has a different internal resistance. Even among batteries of the same type, the battery internal resistance may be different due to different reactions between internal chemical materials. Generally, a battery having a lower internal resistance has a stronger discharge ability while a battery having a higher internal resistance has a weaker discharge ability. In most cases, a battery with a larger capacity has a lower internal resistance, as well as having a higher internal resistance at lower temperatures.

Rechargeable batteries have a lower internal resistance while they are being manufactured. However, after a long time of battery use, the electrolyte in these batteries may become depleted, and the electrochemical activity of the chemical materials in the batteries may become lower, resulting in a higher internal resistance until the battery's internal resistance becomes too high for the battery to discharge properly. In this situation, the battery life of these rechargeable batteries ends.

It should also be noted that the battery internal resistance is not a fixed value, and it can be classified into two types: charging internal resistance and discharging internal resistance. The charging internal resistance is a battery's internal resistance measured at full battery capability, and the discharging internal resistance is a battery's internal resistance measured while the battery is discharging (e.g. the voltage across the battery is discharged to a standard cut-off voltage).

Generally, the discharging internal resistance is not a stable value, and the measured discharging internal resistance is much greater than the normal battery internal resistance. Conversely, the charging internal resistance has a relatively stable value. Thus, the charging internal resistance is usually used in the measurement of the battery's internal resistance.

Figure 1:
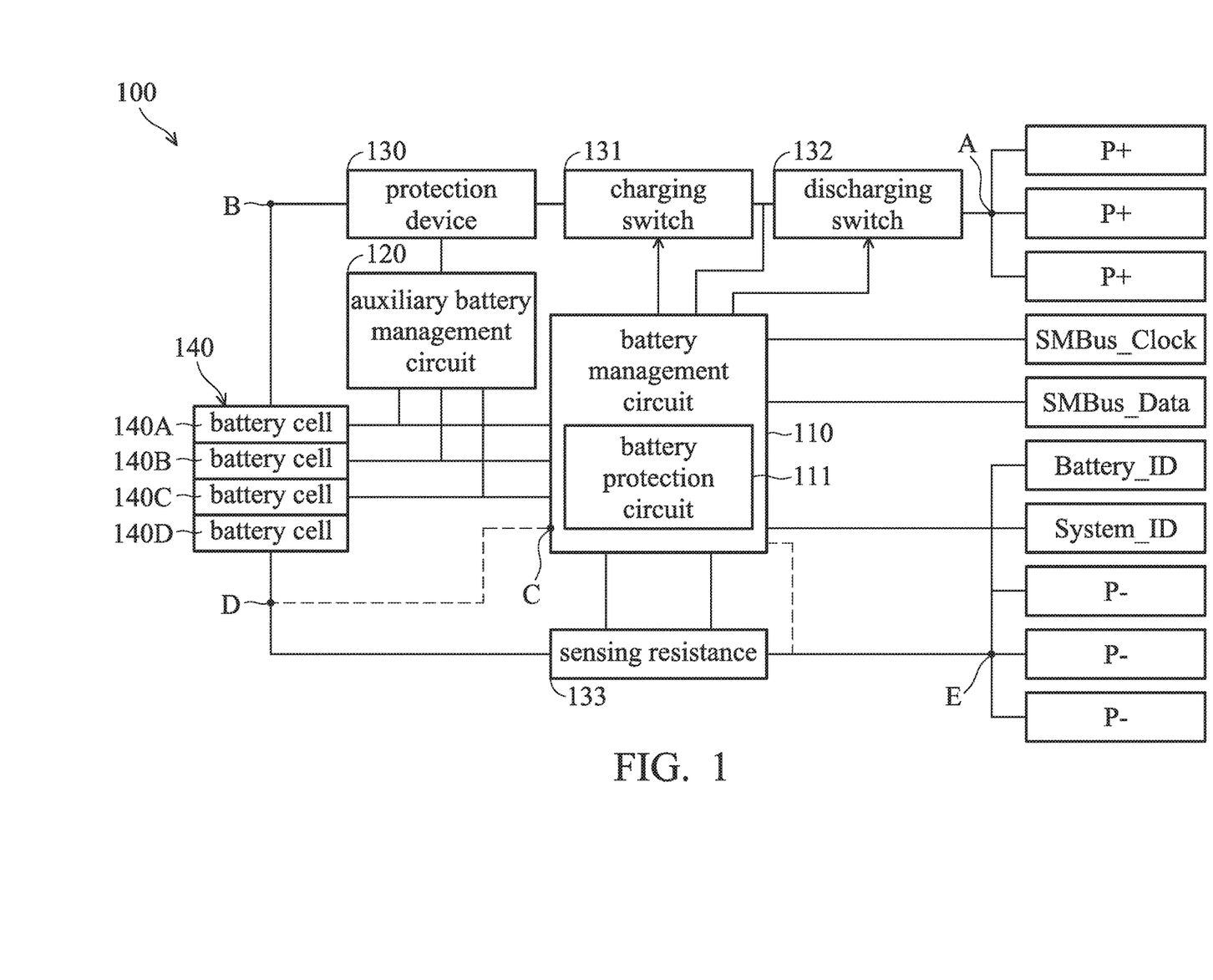
FIG. 1 is a schematic block diagram of a battery device in accordance with an embodiment of the invention.

FIG. 1 is a schematic block diagram of a battery device in accordance with an embodiment of the invention. As illustrated in FIG. 1, the battery device 100 includes a battery management circuit 110, a battery protection circuit 111, an auxiliary battery management circuit 120, a protection device 130, a charging switch 131, a discharging switch 132, a sensing resistance 133, and a battery module 140. The battery management circuit 110 is configured to detect various conditions of the battery device 100, such as the charging/discharging current, temperature, battery internal resistance, etc., and control the charging and discharging of the battery module 140. For example, the battery management circuit 110 may respectively control the charging and discharging of the battery module 140 via the charging switch 131 and the discharging switch 132, and control the protection device 130 (e.g. a fuse) to burn out if necessary. In an embodiment, the battery management circuit 110 may be a gas gauge integrated circuit. In some embodiments, the battery protection circuit 111 may be a stand-alone protection circuit to detect the status of the battery module 140, and to perform an additional battery protection mechanism other than the functions provided by the battery management circuit 110. In some embodiments, the battery protection circuit 111 can be integrated into the battery management circuit 110 (e.g. a battery gas gauge IC).

The auxiliary battery management circuit 120 may detect the current of each battery cell in the battery module 140. If the current of any battery cell is detected beyond a predetermined range, the auxiliary battery management circuit 120 may control the protection device 130 (e.g. a fuse or a switching circuit) to switch to a cut-off state, thereby ensuring the safety of the battery module 140 against an overload current.

Table 1 illustrates the direct current internal resistance (DCIR) of a specific battery cell in different situations, and the charging current and discharging current is defined at 0.5 C and 0.5 C, respectively. Regarding the discharging current, the definition of 1 C is the discharging current that is capable of discharging the battery from its full capacity to its empty capacity in an hour. Regarding the charging current, the definition of 1 C is the charging current that is capable of charging the battery from its empty capacity to its full capacity in an hour. Generally, 0.5 C and 0.5 C are the most appropriate current values for the charging current and the discharging current, respectively.

TABLE 1

|  | Charge Cycles | | | | | |
| --- | --- | --- | --- | --- | --- | --- |
|  | 1 | 100 | 200 | 300 | 400 | 500 |
| DCIR(mohm) @ 10° C. | 308 | 467 | 520 | 541 | 566 | 618 |
| DCIR (mohm) @ 25° C. | 250 | 365 | 389 | 417 | 457 | 482 |
| DCIR (mohm) @ 45° C. | 200 | 275 | 270 | 296 | 315 | 340 |

The model of the battery cell used in Table 1 is "Prismatic Cell 496080 3S1P w/o PCB", and the DCIRs of the battery cell is measured in different situations. For example, the charge cycles may be 1, 100, 200, 300, 400, and 500. Generally, 500 charge cycles can be regarded as the battery life under normal usage. In addition, the operation temperatures of the battery cell are 10, 25, and 45° C.

As illustrated in Table 1, under the same operation temperature, when the charge cycles of the battery cell increases from 1 to 500, the DCIR of the battery cell is approximately doubled. For example, at a temperature of 10° C., the DCIR of the battery cell is increased from 308 mohm to 618 mohm as the charge cycles are increased from 1 to 500. At a temperature of 25° C., the DCIR of the battery cell is increased from 250 mohm to 482 mohm as the charge cycles are increased from 1 to 500. At a temperature of 45° C., the DCIR of the battery cell is increased from 200 mohm to 340 mohm as the charge cycles are increased from 1 to 500.

Assuming that the charge cycles are the same, when the operation temperature of the battery cell is higher, its DCIR is lower. In addition, once the DCIR of the battery cell is increased, it is impossible to reduce its DCIR. That is, the increase of DCIR of the battery cell is permanent.

Table 2 illustrates the alternating current internal resistance (ACIR) of the specific battery cell in different situations, and the charging current and discharging current is defined at 0.5 C and 0.5 C, respectively. The model of the battery cell used in Table 2 is the same as that in Table 1.

TABLE 2

|  | Charge Cycles | | | | | |
| --- | --- | --- | --- | --- | --- | --- |
|  | 1 | 100 | 200 | 300 | 400 | 500 |
| ACIR(mohm) @ 10° C. | 138 | 139 | 139 | 140 | 141 | 141 |
| ACIR (mohm) @ 25° C. | 138 | 140 | 141 | 142 | 142 | 143 |
| ACIR (mohm) @ 45° C. | 137 | 145 | 149 | 151 | 157 | 164 |

As illustrated in Table 2, in the same operation temperature, the ACIR of the battery cell remains almost unchanged as the charge cycles of the battery cell is increased from 1 to 500. In the same charge cycles, the ACIR of the battery cell also remains almost unchanged no matter the operation temperature of the battery cell.

Accordingly, the determination mechanism used in the battery protection circuit 111 is based on the DCIR of the battery cells in the battery module, and it is better for battery management and protection. Specifically, the relationship table between charge cycles and operation temperatures can be built in advance in the invention, such as Table 1. For example, the DCIR of the worst case can be calculated. For example, in the first worst case of the charge cycle being 1 and the operation temperature being 45° C., the DCIR of the battery cell is 200 mohm. In the second worst case of the charge cycle being 500 and the operation temperature being 10° C., the DCIR of the battery cell is 618 mohm. For example, the DCIR values in the first worst case and the second worst case can be used as a first threshold (e.g. 200 mohm) and a second threshold (e.g. 618 mohm) of the DCIR of the battery cell.

In an embodiment, the relationship table (e.g. Table 1) of the DCIR values can be used to determine whether the battery module 140 is problematic. Generally, the DCIR of the battery module 140 under normal use will not exceed the DCIR values in the worst cases. If the DCIR of the battery module 140 under normal use exceeds the DCIR values in the worst cases, it can be determined that the battery module 140 may be problematic, and thus the battery protection circuit 111 may take corresponding actions to prevent further use of the battery module 140.

In an embodiment, the battery protection circuit 111 may inform the battery management circuit 110 to apply a fixed current having a fixed frequency to the battery module 140, such as a charging current having amplitude of 50 mA and a frequency of 1 KHz, and then sample the voltage across the battery module 140. After the sampled voltages are processed by a limiting and filtering circuit, the DCIR of the battery module 140 can be calculated by the battery protection circuit 111. Details for the aforementioned operations will be described later.

Figure 2:
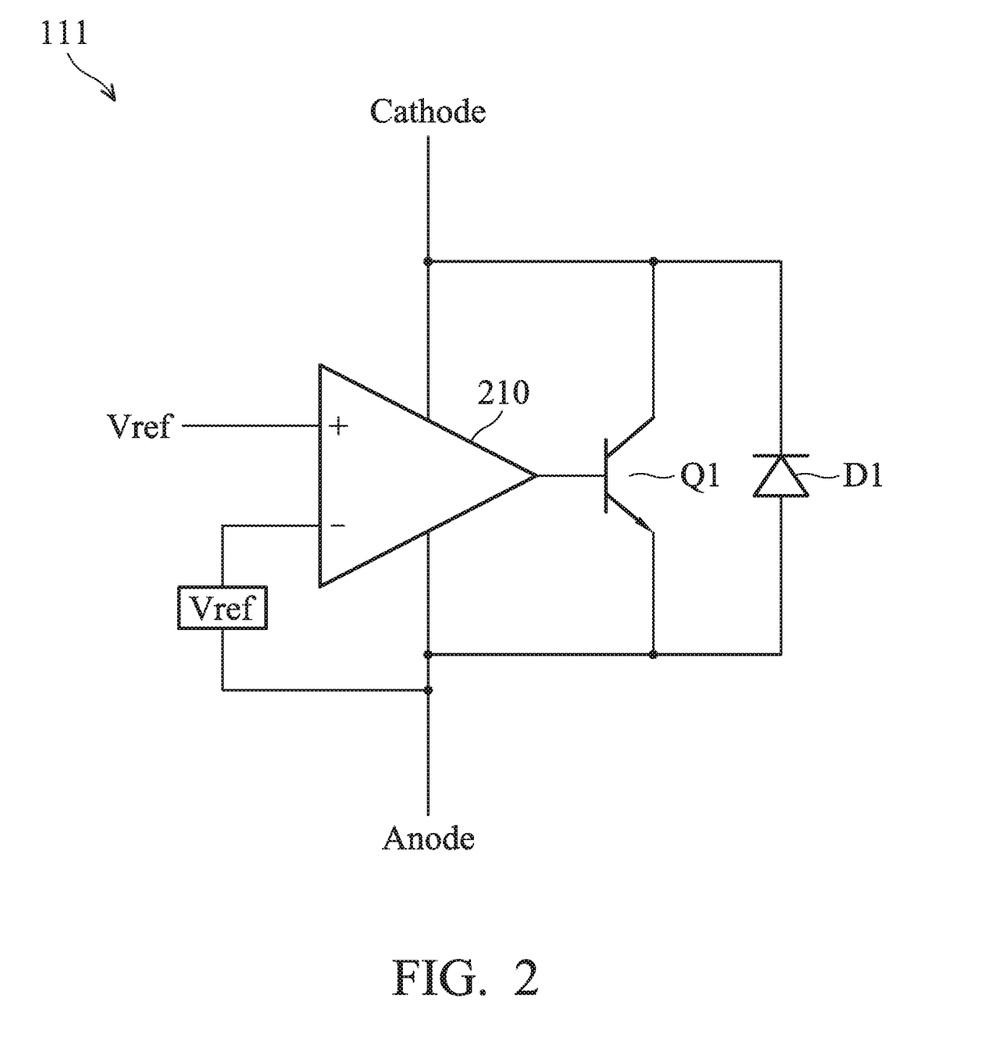
FIG. 2 is a schematic diagram of the battery protection circuit in accordance with an embodiment of the invention.

FIG. 2 is a schematic diagram of the battery protection circuit in accordance with an embodiment of the invention.

As illustrated in FIG. 2, Vref is a reference voltage that is connected to a positive input terminal of the operation amplifier (OP) 210. The power supply terminals of the operation amplifier 210 are connected to the cathode and anode of the battery module 140. One having ordinary skill in the art will appreciate that each component in FIG. 2 can be implemented by a corresponding circuit or another equivalent circuit having the same function.

Figure 3:
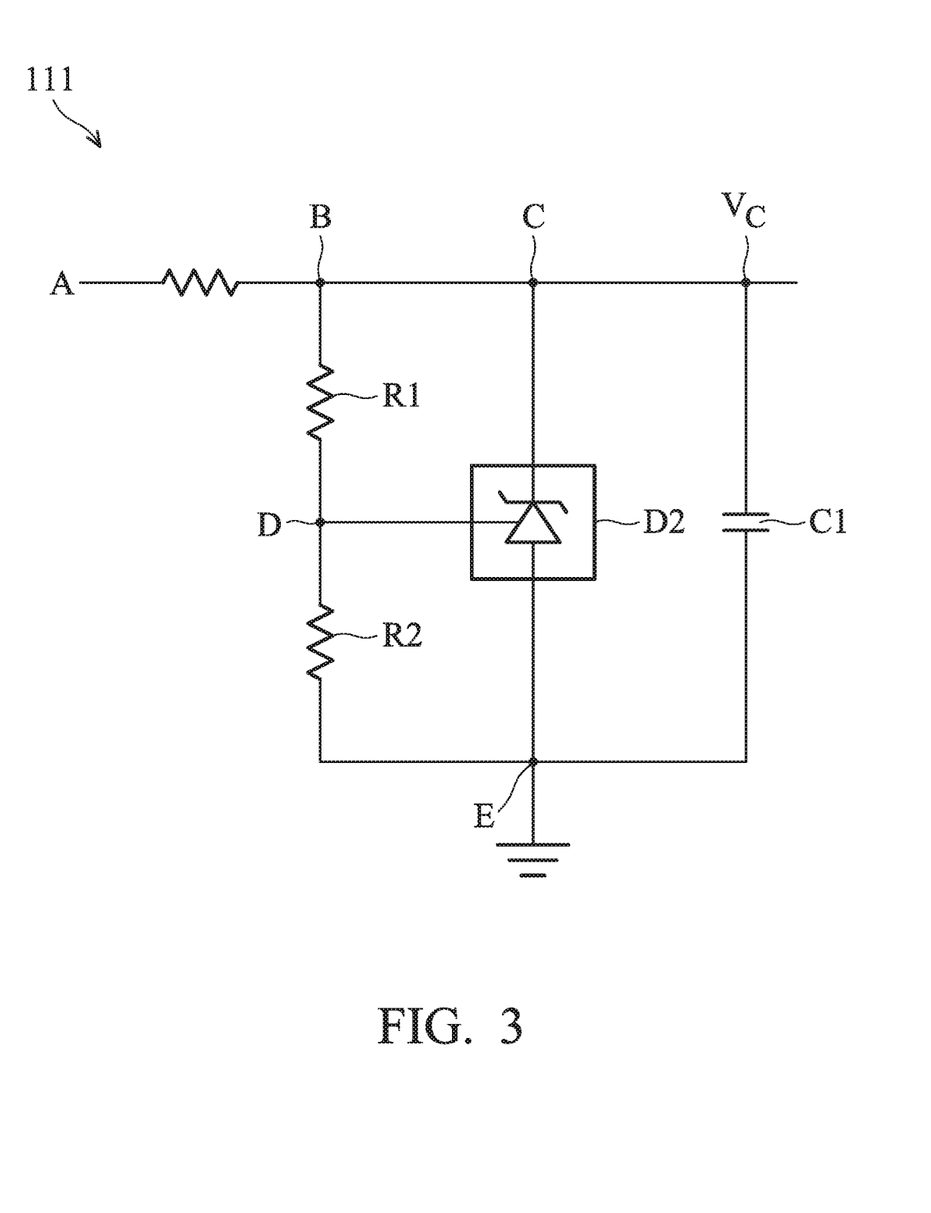
FIG. 3 is an equivalent-circuit diagram of the battery protection circuit in accordance with the embodiment of FIG. 2.

FIG. 3 is an equivalent-circuit diagram of the battery protection circuit in accordance with the embodiment of FIG. 2. The battery protection circuit in FIG. 2 can be described with the equivalent-circuit diagram in FIG. 3.

Referring to FIG. 1 and FIG. 3, node A in FIG. 1 is connected to the positive input terminal P+ of the electronic device that is connected to the battery device 100, and node E is connected to the negative input terminal P− of the electronic device. Node B and node D are respectively located at two terminals of the battery module 140. Node C is located in the battery management circuit 110, and is configured to detect the status of one terminal (e.g. node D) of the battery module 140. In addition, the battery management circuit 110 is also connected to the bus clock signal SMBUS_CLOCK and bus data signal SMBUS_DATA of the bus (e.g. SMBUS), and may transmit the battery identification code Battery_ID to the electronic device and obtain the system identification code from the electronic device via node E.

As illustrated in FIG. 3, the DCIR of the battery module 140 can be regarded as the resistance between the nodes B and D that can be expressed as an equivalent resistance R1. The resistance between nodes D and E can be expressed as an equivalent resistance R2. The operation amplifier 210 can be expressed as a Schottky diode as an equivalent component. The transistor and diode in FIG. 2 can be expressed as a capacitor as an equivalent component.

Accordingly, if the voltage on node C is $V_C$ and the voltage on node D is $V_D$, the relationship between the voltages $V_C$ and $V_D$ can be expressed as the following equation:

$$V_C = (1 + R1/R2)V_D \qquad (1)$$

If the same battery cell Prismatic Cell 496080 in Table 1 is used as an example, the resistance between nodes A and B can be approximated at 10 mohm by accumulating the resistances of the charging switch 131 and the discharging switch 132 arranged in serial (e.g. each about 4.5 mohm), and the resistance of the protection device 130 (e.g. about 1 mohm). The resistance between nodes B and D is the DCIR of the battery module 140 that is normally between 200 mohm and 618 ohm. The resistance R2 between the nodes D and E is the sensing resistance 133 that is approximately 10 mohm. The voltage $V_D$ on the node D is a built-in reference voltage that is approximately 1.25V. Since node B is also connected to the battery management circuit 110, node B can be regarded as node C.

Specifically, in an embodiment, in order to achieve high accuracy in determining an unusual condition in the battery module 140, the battery protection circuit 111 estimates the DCIR values of the battery module 140 at battery levels of 50% and 100%. Generally, the charging current of the battery module 140 is very stable at battery levels of 50% and 100%. That is, variations of the corresponding DCIR values are also very stable.

For example, when the battery level the battery module 140 reaches 50%, the battery protection circuit 111 may inform the battery management circuit 110 to apply a charging current $I_{charge50}$ (e.g. 50 mA) to the battery module 140, and estimate the voltage $V_{pack\_50A}$ across the battery module 140 before applying the charging current, and then estimate the voltage $V_{pack\_50B}$ across the battery module 140 after applying the charging current. Thus, the battery protection circuit 111 may calculate the direct current internal resistance $DCIR_{50\%}$ of the battery module 140 at the battery level of 50% according to the following equation:

$$DCIR_{50\%} = (V_{pack\_50A} - V_{pack\_50B})/I_{charge50} \qquad (2)$$

Similarly, when the battery level of the battery module 140 reaches 100%, the battery protection circuit 111 may inform the battery management circuit 110 to apply a charging current $I_{charge100}$ to the battery module 140 (e.g. 200 mA or 0.1 C), and estimate the voltage $V_{pack\_100A}$ across the battery module 140 before applying the charging current, and then estimate the voltage $V_{pack\_100B}$ across the battery module 140 after applying the charging current. Thus, the battery protection circuit 111 may calculate the direct current internal resistance $DCIR_{100\%}$ of the battery module 140 at the battery level of 100% according to the following equation:

$$DCIR_{100\%} = (V_{pack\_100A} - V_{pack\_100B})/I_{charge100} \qquad (3)$$

If the estimated DCIR value of the battery module 140 is unusual when the battery level of the battery module 140 reaches 50% or 100%, an unusual condition in the battery module 140 can be detected in the charging mode. Thus, necessary preventive actions can be taken in advance, such as cutting-off the protection device 130 (e.g. a fuse), before the battery module 140 causes damage to the portable electronic device.

In an embodiment, the battery protection circuit 111 may periodically inform the battery management circuit 110 to apply a charging current to the battery module 140, and the battery protection circuit 111 may periodically estimate the DCIR values of the battery module 140 at different times. Meanwhile, the battery protection circuit 111 may determine whether any unusual conditions are happening in the battery module 140 according to the predefined DCIR values recorded in Table 1.

Currently, a conventional gas gauge IC is used to estimate the battery level of the battery by comparing the measured voltage with the open-circuit voltage (OCV) value at the same depth of discharge (DOD). For example, the open-circuit voltage (OCV) value can be expressed as a function of depth of discharge (DOD) and time T. In addition, the battery-level detection technique used in a conventional gas gauge IC is designed for "battery discharging", and that is different from the technique disclosed in the invention. Specifically, the technique for detecting unusual conditions in the battery module disclosed in the invention can be performed while the battery module is being charged or when the portable electronic device is still.

Figure 4:
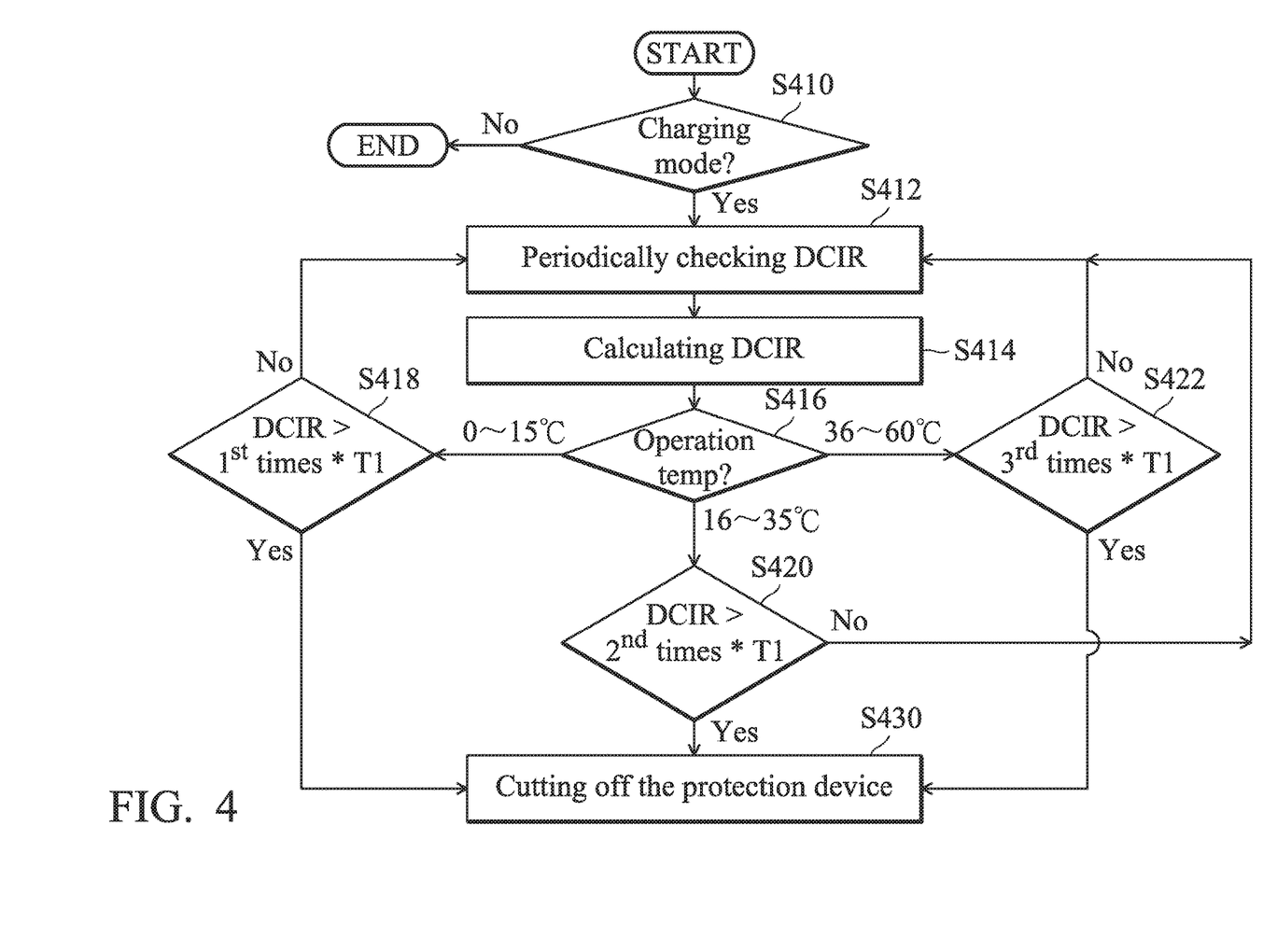
FIG. 4 is a flow chart of the battery protection method in accordance with an embodiment of the invention.

FIG. 4 is a flow chart of the battery protection method in accordance with an embodiment of the invention. In an embodiment, an unusual condition in the battery module 140 can be detected by determining whether the currently estimated DCIR value is higher than the specific times that a predetermined DCIR value is within a specific range of operation temperatures.

For example, referring to Table 1, when the operation temperature is between 0 and 15° C., it is determined whether the current DCIR value is higher than 3 times the first threshold (e.g. 200 mohm). If the current DCIR value is higher than 3 times the first threshold, it is determined that the battery module 140 is unusual, and the protection device 130 is cut off. When the operation temperature is between 16 and 35° C., it is determined whether the current DCIR value is higher than 2.5 times the first threshold (e.g. 200 mohm). If the current DCIR value is higher than 2.5 times the first threshold (e.g. 200 mohm), it is determined that the battery module 140 is unusual, and the protection device 130 is cut off. When the operation temperature is between 36 and 60° C., it is determined whether the current DCIR value is higher than 2 times the first threshold (e.g. 200 mohm). If the current DCIR value is higher than 2 times the first threshold (e.g. 200 mohm), it is determined that the battery module 140 is unusual, and the protection device 130 is cut off. If it is determined that the battery module 140 is not unusual in the aforementioned conditions, the battery protection circuit 111 may periodically estimate the DCIR of the battery module 140 and perform corresponding determination. If the operation temperature of the battery module 140 is above 60° C., the battery management circuit 110 may directly forbid further use of the battery module 140 to prevent potential danger to the battery device 100. It should be noted that the value of the "specific times" or "specific multiple" of the first threshold can be adjusted according to practical conditions.

In step S410, it is determined whether the battery module 140 enters a charging mode. If so, step S412 is performed. Otherwise, the flow ends.

In step S412, the DCIR of the battery module 140 is periodically checked.

In step S414, the DCIR of the battery module 140 is calculated. The calculation of the DCIR of the battery module 140 can be referred to in the aforementioned embodiments. For example, the DCIR of the battery module 140 can be calculated in different ways at different battery levels of the battery module 140.

In step S416, a current operation temperature of the battery device is checked. When the current operation temperature is between 0 and 15° C., step S418 is performed. When the current operation temperature is between 16 and 35° C., step S420 is performed. When the current operation temperature is between 36 and 60° C., step S422 is performed.

In step S418, it is determined whether the DCIR of the battery module 140 is larger than a first multiple of the first threshold T1 (e.g. 3 times). If so, step S430 is performed. Otherwise, step S412 is performed.

In step S420, it is determined whether the DCIR of the battery module 140 is larger than a second multiple of the first threshold T1 (e.g. 2.5 times). If so, step S430 is performed. Otherwise, step S412 is performed.

In step S422, it is determined whether the DCIR of the battery module 140 is larger than a third multiple of the first threshold T1 (e.g. 2 times). If so, step S430 is performed. Otherwise, step S412 is performed. It should be noted that the first multiple, second multiple, and third multiple can be adjusted according to practical conditions.

In step S430, the protection device 130 is cut off. For example, step S430 is performed when an unusual condition in the DCIR of the battery module 140 is detected, and thus the protection device 130 (e.g. a fuse) should be cut off to prevent potential danger to the battery device 100.

In view of the above, a battery device and a battery protection method are provided. The battery protection circuit 111 is capable of providing a battery protection mechanism in addition to that of the battery management circuit 110 (e.g. a gas gauge IC) in the battery device 100. A usual condition in the battery module 140 can be detected by performing different determinations on the DCIR values under different operation temperatures.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A battery device, comprising:
a battery module, comprising one or more battery cells;
a protection device;
a battery management circuit for managing the protection device and charging and discharging of the battery module; and
a battery protection circuit, wherein when the battery device is in a charging mode, the battery protection circuit periodically checks and calculates a direct current internal resistance (DCIR) of the battery module, and determines a current operation temperature of the battery module and a temperature range corresponding to the current operation temperature,
wherein when the battery protection circuit determines that the DCIR is larger than a predetermined multiple of a first threshold corresponding to the temperature range, the battery protection circuit informs the battery management circuit to cut off the protection device,
wherein a first temperature range, a second temperature range, and a third temperature range are defined for the current operation temperature, and the predetermined multiple corresponding to the first temperature range, the second temperature range, and the third temperature range are a first multiple, a second multiple, and a third multiple, respectively.

2. The battery device as claimed in claim 1, wherein the battery management circuit determines a battery level of the battery module, and determines a charging current applied to the battery module according to the determined battery level,
wherein the battery protection circuit further detects a first voltage across the battery module before the charging current is applied to the battery module within a predetermined time period and detects a second voltage across the battery module after the charging current is applied to the battery module within the predetermined time period, and calculates the DCIR of the battery module by dividing a difference value between the first voltage and the second voltage by the charging current.

3. The battery device as claimed in claim 2, wherein the battery level is 50% or 100%.

4. The battery device as claimed in claim 1, wherein the first temperature range, the second temperature range, and the third temperature range are between 0 and 15° C., 16 and 35° C., 36 and 60° C., respectively,
wherein when the current operation temperature exceeds the third temperature range, the battery management circuit directly cuts off the protection device.

5. A battery protection method for use in a battery device, wherein the battery device comprises a battery module, a protection device, a battery management circuit, and battery protection circuit, the method comprising:
when the battery device is in a charging mode, utilizing the battery protection circuit to perform the steps of:
periodically checking and calculating a direct current internal resistance;

determining a current operation temperature of the battery module and a temperature range corresponding to the current operation temperature;

when the battery protection circuit determines that the DCIR is greater than a predetermined multiple of a first threshold corresponding to the temperature range, informing the battery management circuit to cut off the protection device, wherein a first temperature range, a second temperature range, and a third temperature range are defined for the current operation temperature, and the predetermined multiple corresponding to the first temperature range, the second temperature range, and the third temperature range are a first multiple, a second multiple, and a third multiple, respectively.

6. The battery protection method as claimed in claim 5, further comprising:

determining a battery level of the battery module;

determining a charging current applied to the battery module according to the determined battery level; and utilizing the battery protection circuit to detect a first voltage across the battery module before the charging current is applied to the battery module within a predetermined time period and detects a second voltage across the battery module after the charging current is applied to the battery module within the predetermined time period, and calculate the DCIR of the battery module by dividing a difference value between the first voltage and the second voltage by the charging current.

7. The battery protection method as claimed in claim 6, wherein the battery level is 50% or 100%.

8. The battery protection method as claimed in claim 5, wherein the first temperature range, the second temperature range, and the third temperature range are between 0 and 15° C., 16 and 35° C., 36 and 60° C., respectively, and the method further comprises:

when the current operation temperature exceeds the third temperature range, utilizing the battery management circuit to directly cut off the protection device.

* * * * *